United States Patent [19]
Wu et al.

[11] Patent Number: 6,066,419
[45] Date of Patent: May 23, 2000

[54] METHOD FOR MONITORING DOSAGE/FOCUS/LEVELING

[75] Inventors: Cheng-Kuan Wu; Te-Yang Fang, both of Taipei, Taiwan

[73] Assignee: United Semiconductor Corp., Hsinchu, Taiwan

[21] Appl. No.: 09/270,278

[22] Filed: Mar. 16, 1999

[30] Foreign Application Priority Data

Oct. 2, 1998 [TW] Taiwan ................................. 87116427

[51] Int. Cl.$^7$ ...................................................... G03F 9/00
[52] U.S. Cl. ................................................................ 430/30
[58] Field of Search ................................................. 430/30

[56] References Cited

U.S. PATENT DOCUMENTS 5,288,572 2/1994 Giapis et al. ............................. 430/30

Primary Examiner—Christopher G. Young
Attorney, Agent, or Firm—Jiawei Huang; J.C. Patents

[57] ABSTRACT

A method for monitoring dosage/focus/leveling is provided. A control wafer is provided and divided into several regions. Five of the regions near the center of the wafer are used to monitor normally. Other regions are used as dummy shots. When a situation of a stepper changes greatly, the dosage/focus/leveling of the control wafer is monitored using the dummy shots. In monitoring exposure dosage, the middlemost region is monitored. One of the five regions, which is the most central, is exposed with a low exposure energy to enhance sensitivity of critical dimension versus energy. Many points with small areas are developed in the centermost region to take sufficient samples. Since the developed points are close, effects from the nonuniformity of development and from the nonuniformity of the photoresist layer are prevented. In focus/leveling monitoring, a curve diagram of exposure dosage versus critical dimension is provided. An exposure parameter is taken at a range of the curve with a large slope. The focus/leveling is monitored at the other four regions near the middlemost region.

8 Claims, 7 Drawing Sheets

14

METHOD FOR MONITORING DOSAGE/FOCUS/LEVELING

CROSS-REFERENCE TO RELATED APPLICATION

This application claims the priority benefit of Taiwan application serial no. 87116427, filed Oct. 2, 1998, the full disclosure of which is incorporated herein by reference.

BACKGROUND OF THE INVENTION

1. Field of the Invention

The invention relates in general to a method for monitoring semiconductor integrated circuits (ICs), and more particularly to a method for monitoring dosage/focus/leveling at steppers while performing a photolithography process.

2. Description of the Related Art

Photolithography process plays an important role in semiconductor fabrications. For example, a metal oxide semiconductor (MOS) fabrication needs several photolithography processes to pattern several desired patterns and dope active regions. So, the number of photolithography processes taken usually represents the complexity of a fabrication process. The number of masks used also tells the complexity of a fabrication, because each photolithography process needs one mask.

According to reduction of the size of integrated circuits, process windows of a photolithography process, such as exposure energy (EE) and depth of focus (DOF), diminish. The baseline, such as exposure dosage, accuracy of focus or leveling of a chip, of a stepper must be controlled carefully during commercial production, so that an efficient monitoring system is required to ensure processes that are performed correctly.

A conventional method for measuring an exposure dosage is using a photo-speed monitor stepper to control the exposure dosage. When a photoresist layer on a wafer is exposed completely, that means the exposure dosage applied on the wafer is enough. The wafer is divided into several regions. Exposure dosage of a first region is lower than of a second region. Exposure dosage of the second region is lower than of a third region. The regions are checked one by one to determine whether the regions are developed. If some regions are not developed, the exposure dosage is insufficient. On the other hand, of regions are developed completely, the exposure dosage is sufficient. An exposure dosage of a stepper can be adjusted according to the results described above. However, to observe exposure is not easy due to nonuniformity of the photoresist layer and nonuniformity of developing.

Conventionally, a stepper laser beam is used to monitor the depth of focus of the stepper. Pattern length is measured under different defocus conditions according optical diffraction theory. The pattern length is the longest when the focus is correct. However, this process occupies the stepper for about 10 minutes.

A wafer placed on the stepper may be sloped so that the best focus is different at different position of the wafer. A conventional method uses an auto focus beam detect stepper to level the stepper stage. This process occupies the stepper for about 40 minutes.

These methods for monitoring dosage/focus/leveling are complicated and are performed sequentially. The methods require three wafers and parameters. Furthermore, the methods have to use a stepper so that they are unsuited for daily commercial production monitoring.

SUMMARY OF THE INVENTION

It is therefore an object of the invention to provide a method for simultaneously monitoring dosage/focus/leveling. An exposure pattern is designed on a control wafer. Different positions of the control wafer are applied with different exposure parameters.

It is therefore another object of the invention to provide a monitoring method using a scanning electron microscope (SEM). The method is not performed on a stepper and so is suitable for daily monitoring.

The invention achieves the above-identified objects by providing a method for monitoring dosage/focus/leveling. A control wafer is provided and divided to several regions. Five of the regions near the center of the wafer are used for normal monitoring. Other regions are used as dummy shots. When a situation of a stepper changes eminently, the dosage/focus/leveling of the control wafer is monitored using the dummy shots. In monitoring exposure dosage, the middlemost region is monitored. One of the five regions, which is the middlemost, is applied a low exposure energy to enhance sensitivity of critical dimension versus energy. Many points with small areas are developed at the middlemost region to take enough samples. Since the developed points are close, effects from the nonuniformity of development and from the nonuniformity of the photoresist layer are prevented. In focus/leveling monitoring, a curve diagram of exposure dosage versus critical dimension is provided. An exposure parameter is taken at a range of the curve with a large slope. The focus/leveling is monitored at the other four regions near the middlemost region.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 1A:
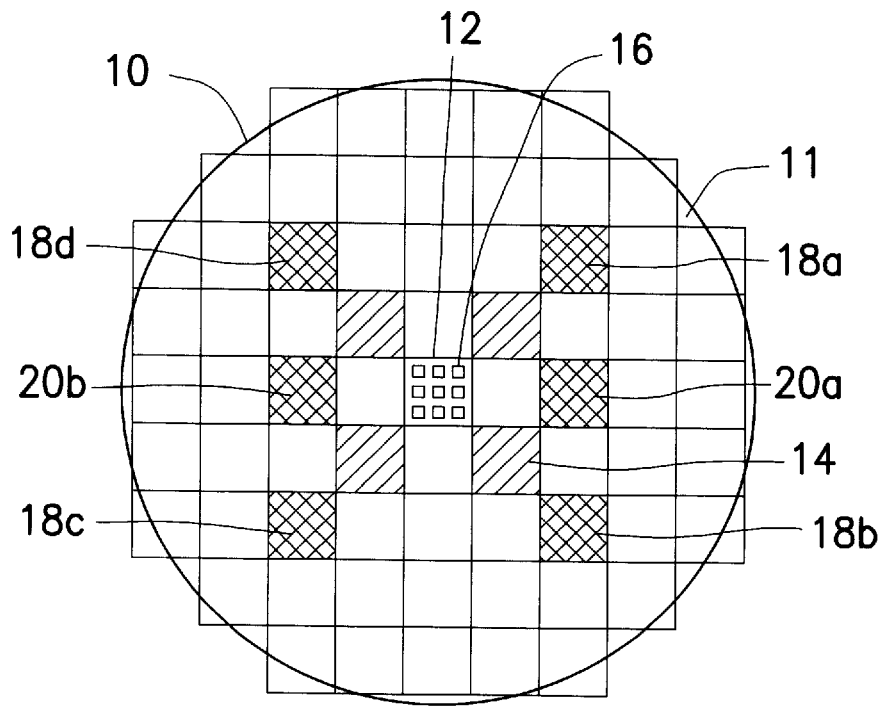
FIG. 1A is a schematic diagram showing monitoring regions of a control wafer of one preferred embodiment of the invention.

In FIG. 1A, a control wafer 10 is provided. An anti-reflecting coating (ARC) layer 11 is formed on the control wafer 10 to prevent light reflecting from the control wafer 10. A material of that ARC layer 11 comprises an organic ARC layer or an inorganic ARC layer. A first region 12 and four, second regions 14 are defined on the control wafer 10 and near the center of the control wafer 10. The first region 12 and the second regions 14 are monitored under normal stepper conditions. Normal conditions means that focus difference is between −0.3 to 0.3 μm and leveling difference is between −15 to 15 μrad. A scanning electron microscope (SEM) is used to monitor so that stepper operation time is not used. Several exposure points 16 are formed in the first region 12 using small reticle blind to take samples. Since the exposure points 16 are close in the first region 12, effects from nonuniformity of the photoresist layer and from non-uniformity of the development can be prevented.

Furthermore, the first dummy shots 18a, 18b, 18c, 18d and second dummy shots 20a, 20b are set at the other region of the control wafer 10. These dummy shots 18a, 18b, 18c, 18d, 20a and 20b are monitored when the condition of the stepper changes are great, for example, the focus difference is larger than 0.3 μm and the leveling difference is larger than 15 μrad. The first dummy shot 18a is monitored when the x-axis leveling difference is larger that 15 μrad. The first dummy shot 18b is monitored when the x-axis leveling difference is smaller than −15 μrad. The first dummy shot 18c is monitored when the y-axis leveling difference is larger than 15 μrad. The first dummy shot 18d is monitored when the y-axis leveling difference is smaller than −15 μrad. The second dummy shot 20a is monitored when the focus difference is larger than 0.3 μm. The second dummy shot 20b is monitored when the focus difference is smaller than −0.3 μm.

Figure 1B:
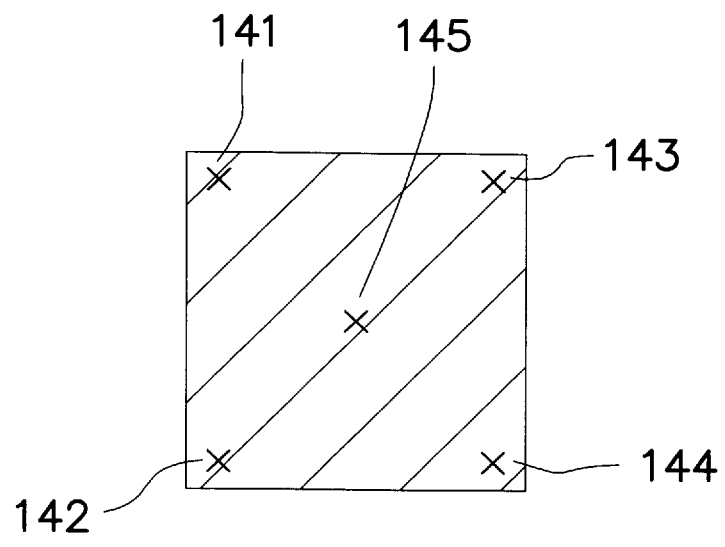
FIG. 1B is a magnification of a schematic diagram of the second of the monitoring regions shown in FIG. 1A.

FIG. 1B is a schematic, blown-up diagram showing the second region 14 in the FIG. 1A. There are four detecting points 141, 142, 143 and 144 at the four corners of the second region 14 and a detecting point 145 at the center of the second region 14. The central detecting point is used to monitor the focus difference. The four detecting point 141, 142, 143, 144 are used to monitor the leveling difference. CD differences detected at the four detecting points 141, 142, 143, 144 are used in an equation $$(143+144)-(141+142)$$

to obtain the degree of x-axis slope. The CD difference are used in an equation $$(141+143)-(142+144)$$

to obtain the degree of y-axis slope.

Figure 2:
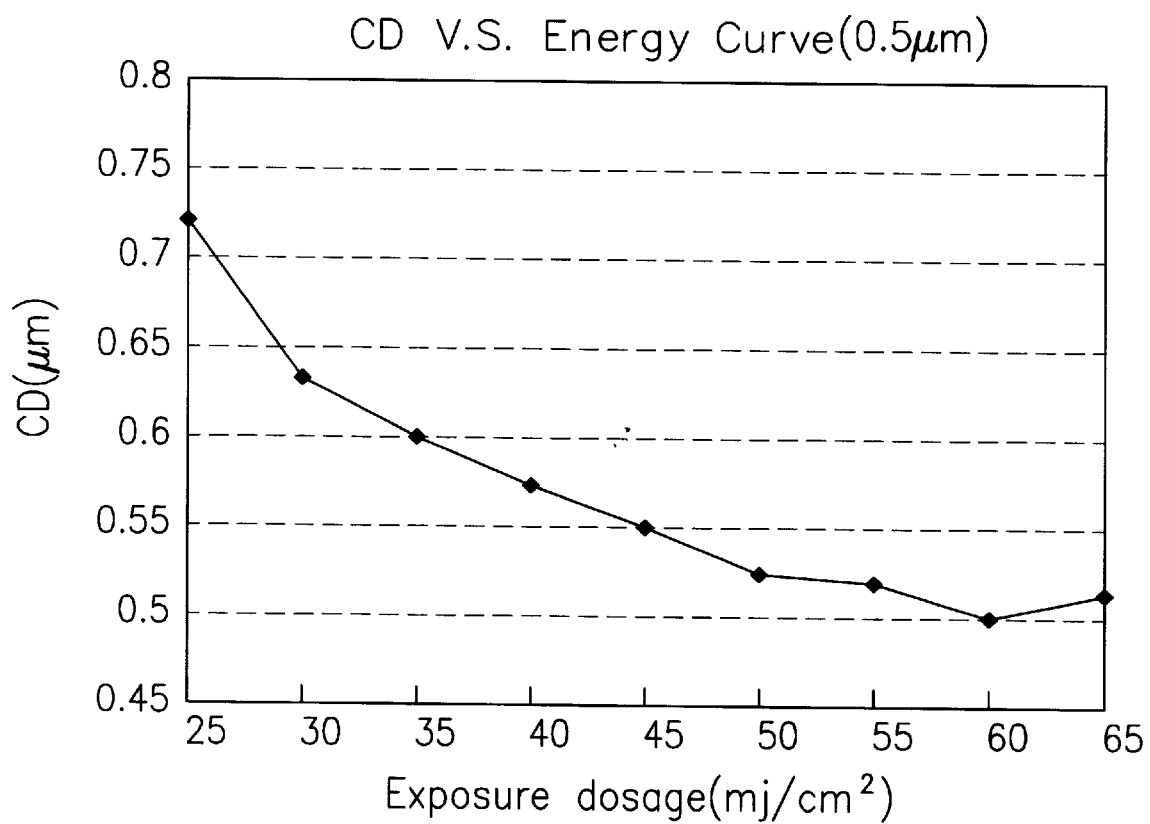
FIG. 2 is a curve diagram of exposure dosage versus critical dimension (CD)

In FIG. 2, the first region 12 is used to monitor exposure dosage. An exposing process is performed at the first region 12 with a low exposure energy. In the low-energy range of a curve shown in the FIG. 2, the slope of the curve is steeper than other range of the curve so that the sensitivity of CD is increased. An exposure level is observed during a constant period. A low exposure level or an increase in CD means that stepper exposure energy is lower than a predetermined energy. On the other hand, a high exposure level or a decrease in CD means that the stepper exposure energy is higher than the predetermined energy.

Figure 3:
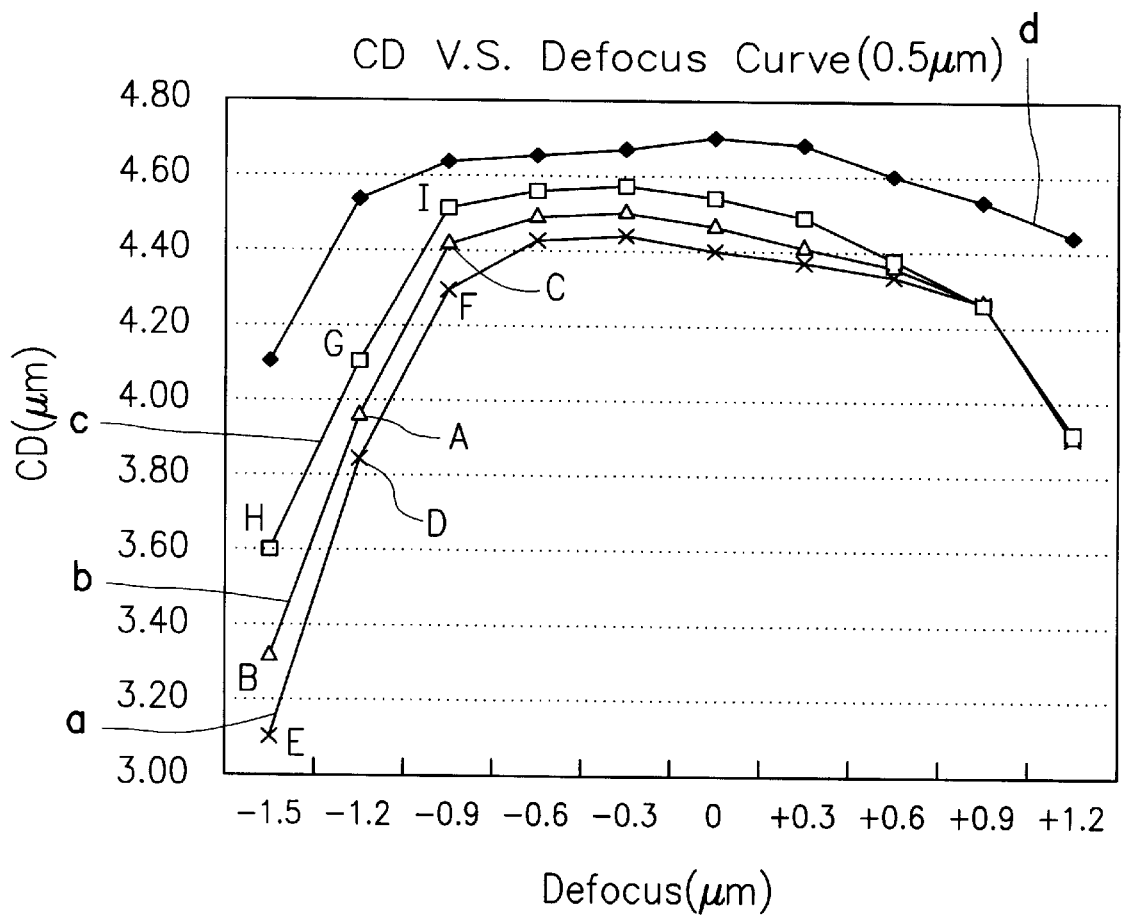
FIG. 3 is a curve diagram of defocus versus CD.

In FIG. 3, an exposure energy of curve a is higher than that of curve b. The exposure energy of curve b is higher than that of curve c. The exposure energy of curve c is higher than that of curve d. An exposure parameter is chosen within a range with the steepest slope of the curves. The sensitivity of CD difference within the range is better than in other ranges. For example, an exposure parameter at point A of the curve b is chosen. The sensitivity of point A is represented as $$(4.0-3.3)/(1.5-1.2) = 0.23\ \mu m/0.1\ \mu m.$$

The result means that the CD difference is 0.23 μm when focus difference is 0.1 μm so that the focus is monitored easily by large change in the CD difference. As shown in FIG. 3, the preferred range for monitoring focus is between about −0.3–0.3 μm (−1.2±0.3 μm) so that the region of the curve b, which has a greatly changing slope, is selected.

Figure 4:
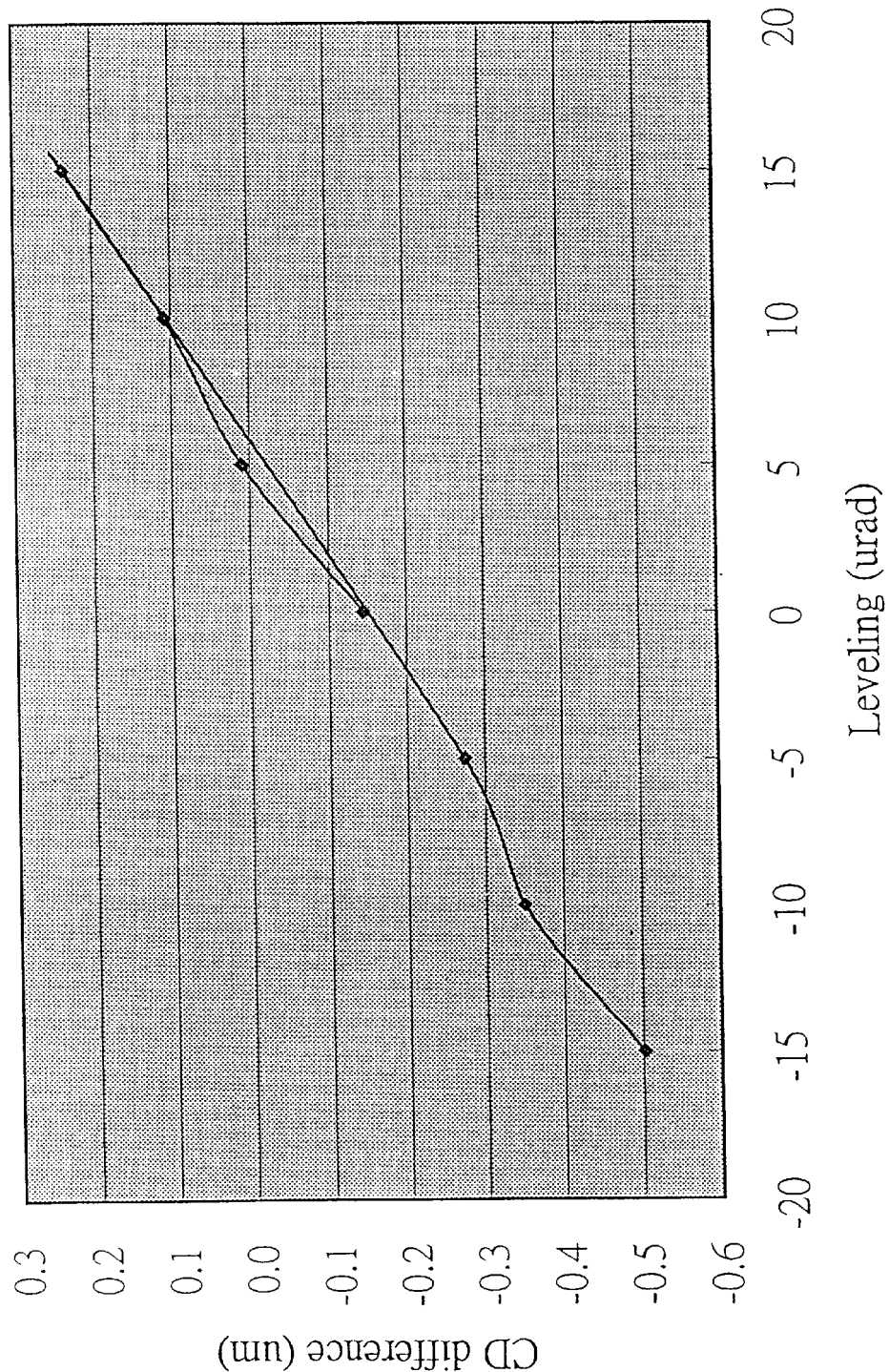
FIG. 4 is a curve diagram of CD difference versus leveling sensitivity of x-axis of one preferred embodiment of the invention.
Figure 5:
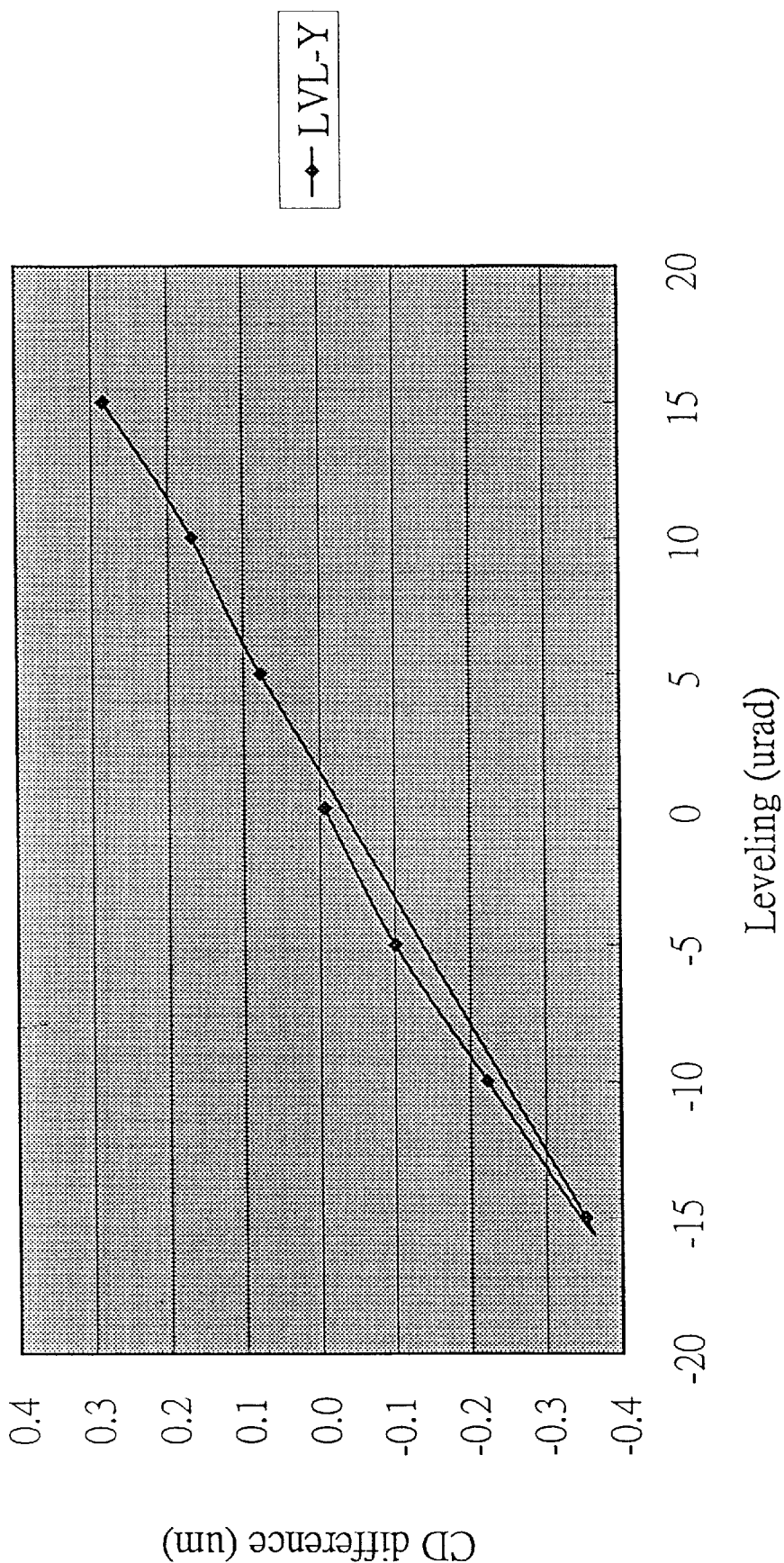
FIG. 5 is a curve diagram of CD difference versus leveling sensitivity of y-axis of one preferred embodiment of the invention.

FIG. 4 is a curve diagram of CD difference versus leveling sensitivity of the x-axis of the invention. FIG. 5 is a curve diagram of CD difference versus leveling sensitivity of the y-axis of the invention. The range of leveling difference of the x-axis and the range of leveling difference of the y-axis are the same and between about −15–15 μrad. The range of the CD difference of x-axis is between 0.15 μm when leveling difference of the x-axis changes in every 5 μrad. The CD difference of y-axis is between 0.10 μm when leveling difference of the y-axis changes in every 5 μrad. In the invention, the sensitivity of focus can achieve about 0.1 μm. The monitoring range of focus is between about −0.3–0.3 μm. The leveling sensitivity can achieve about 5 μrad. The monitoring range of leveling is between about −15–15 μrad. These ranges cover variations of a machine to properly produce devices with small line width. The method provided by the invention is properly used in I-line steppers and deep-UV steppers.

Figure 6:
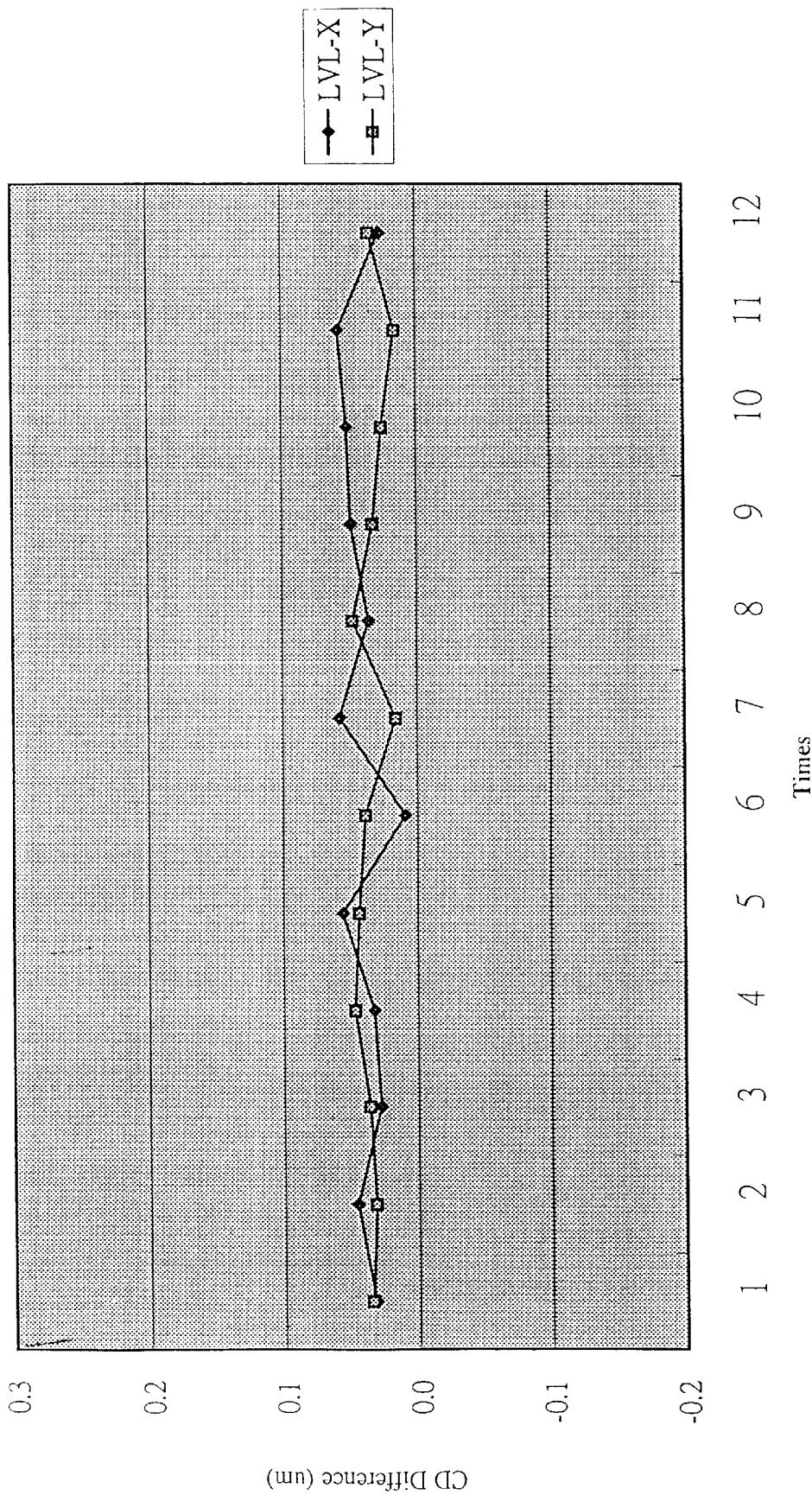
FIG. 6 is a curve diagram showing a leveling repeatability curve of one preferred embodiment of the invention.
Figure 7:
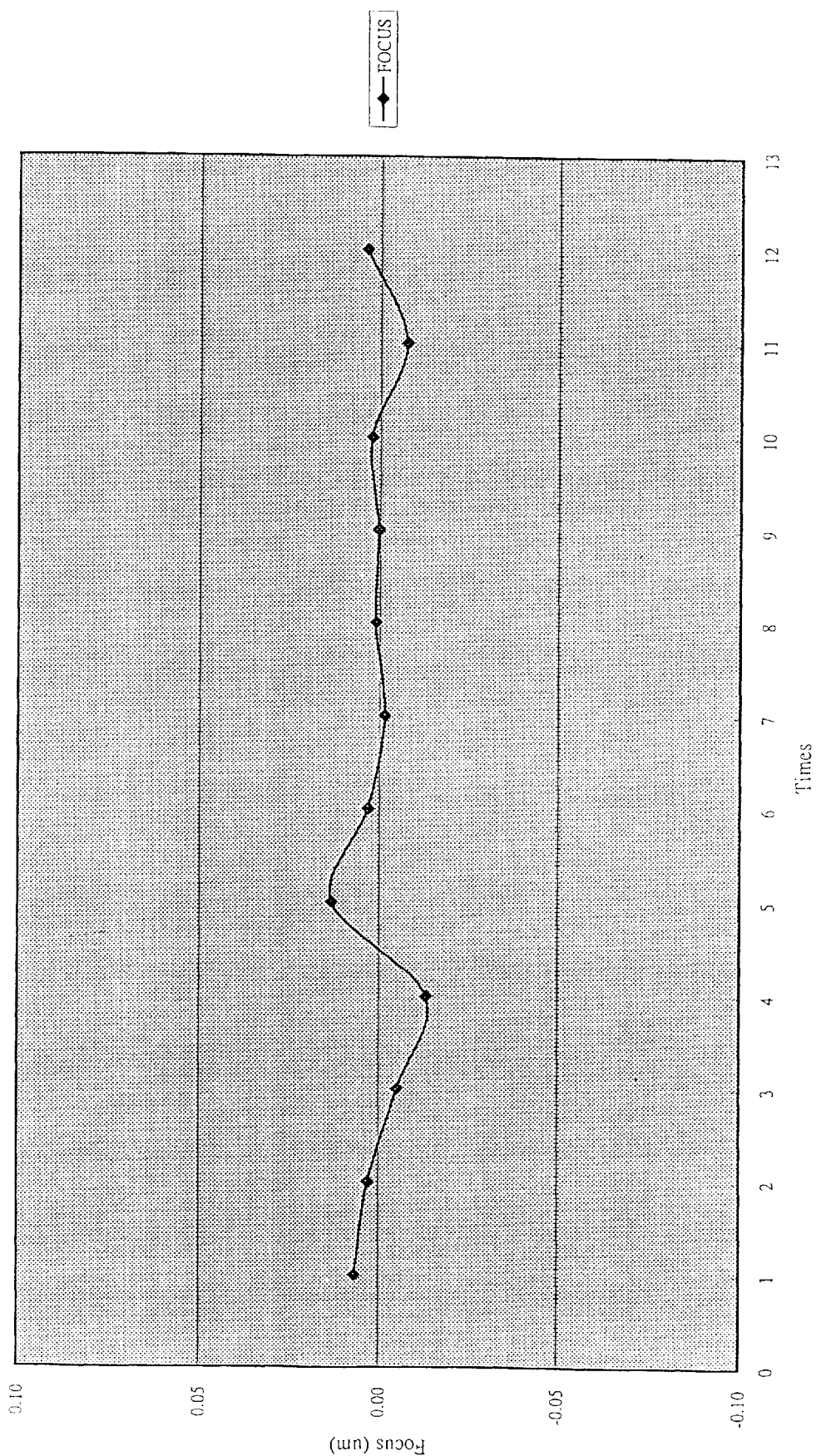
FIG. 7 is a curve diagram showing a focus repeatability curve of one preferred embodiment of the invention.

In FIG. 6, LVL-X represents a leveling curve of the x-axis. LVL-Y represents a leveling curve of the Y-axis. The monitoring result shows that the CD difference is small that 0.04 μm (the leveling difference is smaller than 1.5 μrad) according the method of the invention. FIG. 7 is a focus repeatability curve. The monitoring result shown that the focus difference is between −0.026 μm–0.026 μm according to the method of the invention.

A feature of the invention is a method for simultaneously monitoring dosage/focus/leveling. The method only requires a controlling wafer for monitoring. The controlling wafer is divided into several regions, which have difference exposure parameters. The controlling wafer is analyzed using SEM so that stepper operational time is not occupied for routine detection.

Another feature of the invention is that a monitoring range covers both slight and large difference using dummy shots of the controlling wafer while the machine is off-center.

While the invention has been described by way of example and in terms of a preferred embodiment, it is to be understood that the invention is not limited thereto. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for monitoring dosage/focus/leveling, comprising the steps of:

provoiding a controlling wafer comprising a first region, second regions, first dummy shots and second dummy shots, wherein the first region has exposure points;

applying a low exposure energy to the exposure points of the first region to monitor exposure dosage; and applying a high exposure energy to the second regions to monitor focus and leveling.

2. The method according to claim 1, wherein an anti-reflecting layer is formed on the controlling wafer.

3. The method according to claim 2, wherein the anti-reflecting layer is an organic layer.

4. The method according to claim 2, wherein the anti-reflecting layer is an inorganic layer.

5. The method according to claim 1, wherein a monitoring range of focus is between about $-0.3$ $\mu$m and about $0.3$ $\mu$m.

6. The method according to claim 5, wherein the first dummy shots are monitored when the monitoring range of focus is smaller than $-0.3$ $\mu$m or larger than $0.3$ $\mu$m.

7. The method according to claim 1, wherein a monitoring range of leveling is between about $-15$ $\mu$rad and about $15$ $\mu$rad.

8. The method according to claim 7, wherein the second dummy shots are monitored when the monitoring range of leveling is smaller than $-15$ $\mu$rad or larger than $15$ $\mu$rad.

* * * * *